(12) United States Patent
Lin et al.

(10) Patent No.: US 10,135,198 B2
(45) Date of Patent: Nov. 20, 2018

(54) ELECTRICAL CONNECTOR ASSEMBLY

(71) Applicant: LOTES CO., LTD, Keelung (TW)

(72) Inventors: Chin Chi Lin, Keelung (TW); Cheng Wei Lo, Keelung (TW)

(73) Assignee: LOTES CO., LTD, Keelung (TW)

(*) Notice: Subject to any disclaimer, the term of this patent is extended or adjusted under 35 U.S.C. 154(b) by 0 days.

(21) Appl. No.: 15/892,743

(22) Filed: Feb. 9, 2018

(65) Prior Publication Data

US 2018/0233860 A1    Aug. 16, 2018

Related U.S. Application Data

(60) Provisional application No. 62/459,756, filed on Feb. 16, 2017.

(30) Foreign Application Priority Data

Jan. 10, 2018    (CN) .......................... 2018 1 0021460

(51) Int. Cl.
| | |
|---|---|
| *H01R 13/6591* | (2011.01) |
| *H01R 12/71* | (2011.01) |
| *H01R 13/405* | (2006.01) |
| *H01R 13/6581* | (2011.01) |
| *H05K 7/20* | (2006.01) |

(Continued)

(52) U.S. Cl.
CPC ..... *H01R 13/6591* (2013.01); *H01L 23/3675* (2013.01); *H01R 12/53* (2013.01); *H01R 12/57* (2013.01); *H01R 12/716* (2013.01); *H01R 12/725* (2013.01); *H01R 12/732* (2013.01); *H01R 13/405* (2013.01); *H01R 13/506* (2013.01); *H01R 13/516* (2013.01); *H01R 13/5213* (2013.01); *H01R 13/5216* (2013.01); *H01R 13/6581* (2013.01); *H01R 13/665* (2013.01); *H05K 1/0203* (2013.01);

(Continued)

(58) Field of Classification Search
CPC .................................................. H01R 13/6591
See application file for complete search history.

(56) References Cited

U.S. PATENT DOCUMENTS

2008/0248684 A1* 10/2008 Filipon .............. H01R 13/6658
                                                                439/485
2009/0093137 A1*  4/2009 Badehi ................ G02B 6/4201
                                                                  439/61

(Continued)

FOREIGN PATENT DOCUMENTS

| CN | 105703160 A | 6/2016 |
| CN | 205846310 U | 12/2016 |

*Primary Examiner* — James Harvey
(74) *Attorney, Agent, or Firm* — Locke Lord LLP; Tim Tingkang Xia, Esq.

(57) ABSTRACT

An electrical connector assembly includes: a circuit board; a connector, located in front of the circuit board and electrically connected to the circuit board; a chip, provided on the circuit board, and electrically connected to the circuit board; a metal shell, covering the connector and the circuit board; and an inner film, made of a high heat conductive material, and wrapping the chip and the circuit board. At least a part of the inner film is located between the metal shell and the circuit board. When the chip generates a great amount of heat, the inner film, serving as a medium, can absorb the heat rapidly and conduct the heat to the metal shell so as to dissipate the heat outside.

20 Claims, 9 Drawing Sheets

(51) Int. Cl.

| | |
|---|---|
| *H01L 23/367* | (2006.01) |
| *H01R 12/72* | (2011.01) |
| *H01R 12/73* | (2011.01) |
| *H01R 13/52* | (2006.01) |
| *H01R 12/53* | (2011.01) |
| *H01R 12/57* | (2011.01) |
| *H01R 13/506* | (2006.01) |
| *H01R 13/516* | (2006.01) |
| *H01R 13/66* | (2006.01) |
| *H05K 1/02* | (2006.01) |
| *H01R 13/6594* | (2011.01) |

(52) U.S. Cl.
CPC ....... *H05K 7/2039* (2013.01); *H05K 7/20154* (2013.01); *H01R 13/6594* (2013.01)

(56) References Cited

U.S. PATENT DOCUMENTS

| | | | |
|---|---|---|---|
| 2010/0303424 A1* | 12/2010 | Furuyama | G02B 6/4201 385/92 |
| 2014/0168919 A1* | 6/2014 | Ishimatsu | H01R 4/04 361/760 |
| 2014/0349514 A1* | 11/2014 | Yang | H01R 13/6581 439/487 |
| 2016/0211626 A1* | 7/2016 | Long | H01R 12/721 |
| 2017/0257960 A1* | 9/2017 | Dohi | H05K 5/0278 |
| 2017/0261711 A1* | 9/2017 | Chiang | G02B 6/4267 |
| 2018/0014429 A1* | 1/2018 | Ju | H01R 12/7064 |
| 2018/0014430 A1* | 1/2018 | Lin | H01R 12/721 |
| 2018/0233848 A1* | 8/2018 | Lin | H01L 23/3675 |
| 2018/0233860 A1* | 8/2018 | Lin | H01R 13/665 |

\* cited by examiner

ELECTRICAL CONNECTOR ASSEMBLY

CROSS-REFERENCE TO RELATED PATENT APPLICATION

This non-provisional application claims priority to and the benefit of, pursuant to 35 U.S.C. § 119(e), U.S. provisional patent application Ser. No. 62/459,756 filed Feb. 16, 2017, and under 35 U.S.C. § 119(a), patent application Serial No. CN201810021460.0 filed in China on Jan. 10, 2018. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector assembly, and more particularly to an electrical connector assembly with excellent heat dissipation performance.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the development of science technology nowadays, the requirement for an electrical connector is getting higher and higher, and the transmission rate of the electrical connector is increasing all the time. With the increase of the transmission speed of a connector, it is usually necessary to additionally equip the connector with a chip, thus achieving the aim of increasing the transmission rate by means of the performance of the chip. However, while the processing speed is increased by adding the chip, a great amount of heat is generated during operation of the chip. Thus, if the chip is maintained at a high temperature, the processing speed of the chip will be affected, and therefore heat dissipation becomes another issue to be solved.

Therefore, a heretofore unaddressed need to design a novel electrical connector assembly exists in the art to address the aforementioned deficiencies and inadequacies.

SUMMARY

The present invention is directed to provide an electrical connector assembly with excellent heat dissipation performance.

To achieve the foregoing objective, the present invention adopts the following technical solutions.

An electrical connector assembly includes: a circuit board; a connector, located in front of the circuit board and electrically connected to the circuit board; a chip, provided on the circuit board, and electrically connected to the circuit board; a metal shell, covering the connector and the circuit board; and an inner film, made of a high heat conductive material and wrapping the chip and the circuit board, wherein at least a part of the inner film is located between the metal shell and the circuit board.

In certain embodiments, the inner film is in contact with the metal shell.

In certain embodiments, the inner film is in contact with all inner surfaces of the metal shell.

In certain embodiments, the connector is provided with a shell, and the inner film is in contact with the shell.

In certain embodiments, the inner film is in contact with all outer surfaces of the shell.

In certain embodiments, the connector is provided with at least one terminal being soldered to the circuit board, and the inner film is in contact with the at least one terminal.

In certain embodiments, a heat dissipation member wraps the metal shell, and a thermally conductive portion is located between the metal shell and the heat dissipation member.

In certain embodiments, the thermally conductive portion is provided on the metal shell and is in contact with the heat dissipation member, or the thermally conductive portion is provided on the heat dissipation member and is in contact with the metal shell.

In certain embodiments, at least two fins are provided on an outer wall surface of the heat dissipation member, and at least one groove is provided between each of two adjacent fins of the at least two fins.

In certain embodiments, the at least two fins are arranged in a front-rear direction longitudinally.

In certain embodiments, the inner film is partially exposed from the metal shell and wraps the metal shell.

In certain embodiments, a heat dissipation member wraps the metal shell, and the inner film is located between the metal shell and the heat dissipation member and is in contact with the heat dissipation member.

In certain embodiments, the inner film is in contact with all inner wall surfaces of the heat dissipation member.

In certain embodiments, a cable is provided with a core wire being soldered to the circuit board, and the inner film is in contact with the core wire.

In certain embodiments, a heat dissipation spring is provided to sleeve the cable, the heat dissipation spring is provided with a main body portion, and the main body portion is in contact with the metal shell.

In certain embodiments, the heat dissipation spring is provided with a heat dissipation portion extending into the metal shell from the main body portion, and the inner film is in contact with the heat dissipation portion.

In certain embodiments, the inner film is composed of an insulating material and a conductive material, and a proportion of the mass of the conductive material to the inner film is lower than a proportion of the mass of the insulating material to the inner film.

In certain embodiments, the metal shell is provided with at least one through hole, and the inner film is exposed from the at least one through hole.

In certain embodiments, the inner film completely wraps the circuit board.

In certain embodiments, the inner film is composed of a graphite material and an insulating material, and a proportion of the mass of the graphite material to the inner film is lower than a proportion of the mass of the insulating material to the inner film.

Compared with the related art, the present invention adopts an inner film made of a high heat conductive material. The inner film is injection-molded in the metal shell to wrap the chip and the circuit board, and the metal shell covers the inner film and is in contact with multiple surfaces of the inner film, such that much heat generated on the chip can be transmitted to the inner film more rapidly, and the heat can be further transmitted to the metal shell rapidly via the inner film. The inner film further includes another part wrapping the metal shell, such that the inner film can be in direct contact with the heat dissipation member, providing another heat dissipation path, and thereby enhancing a heat dissipation effect to greatly improve the heat dissipation performance finally.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector assembly.

Referring to FIG. 1 to FIG. 6, which show an electrical connector assembly 100 according to a main embodiment of the present invention, including a connector 1, a circuit board 2, a chip 3, an inner film 4, a metal shell 5, a heat dissipation member 6 and a cable 7. The inner film 4 serves as a medium for conducting heat of the chip 3 to the outside.

Figure 1:
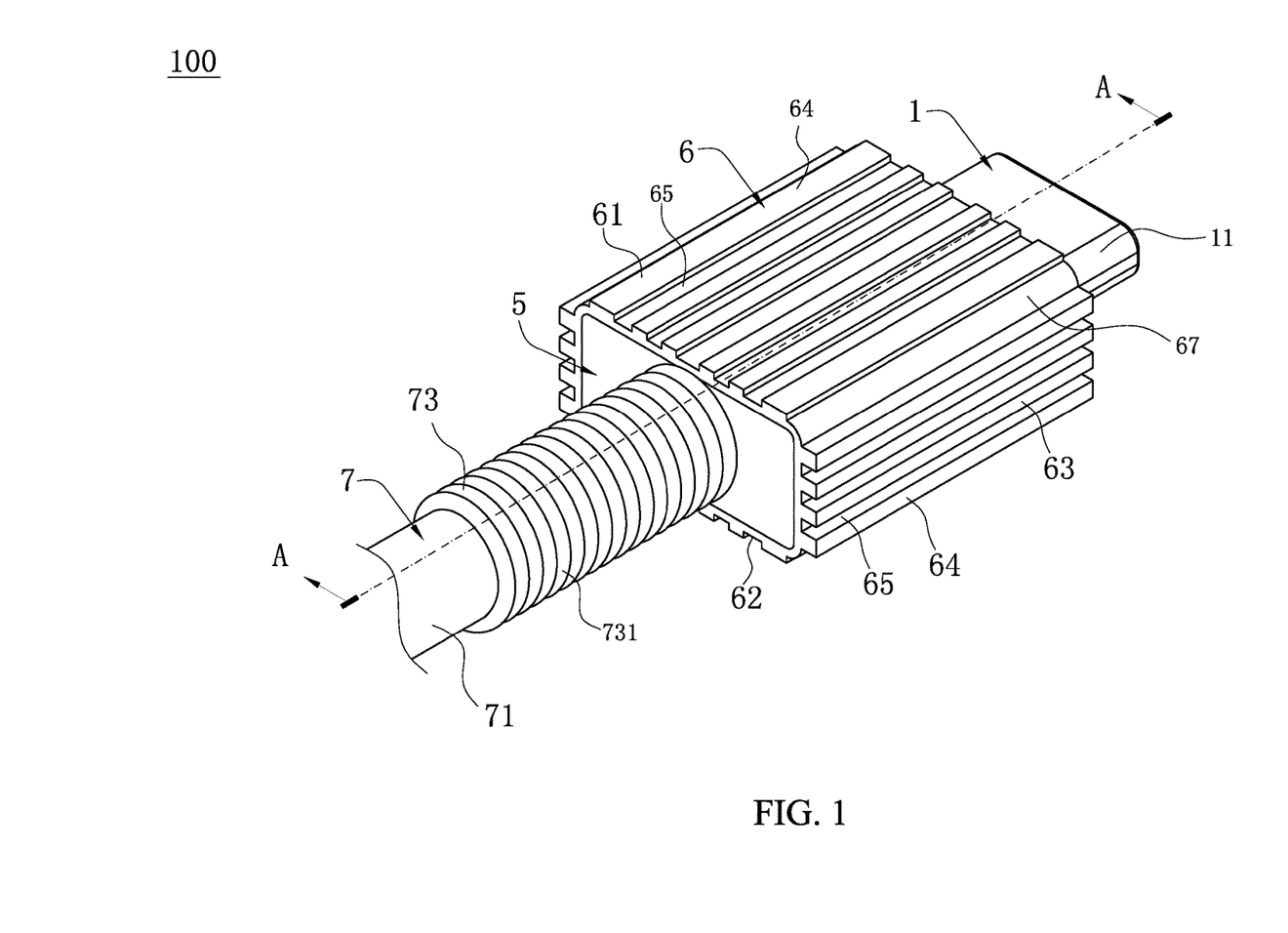
FIG. 1 is a perspective view of an electrical connector assembly according to one embodiment of the present invention.
Figure 2:
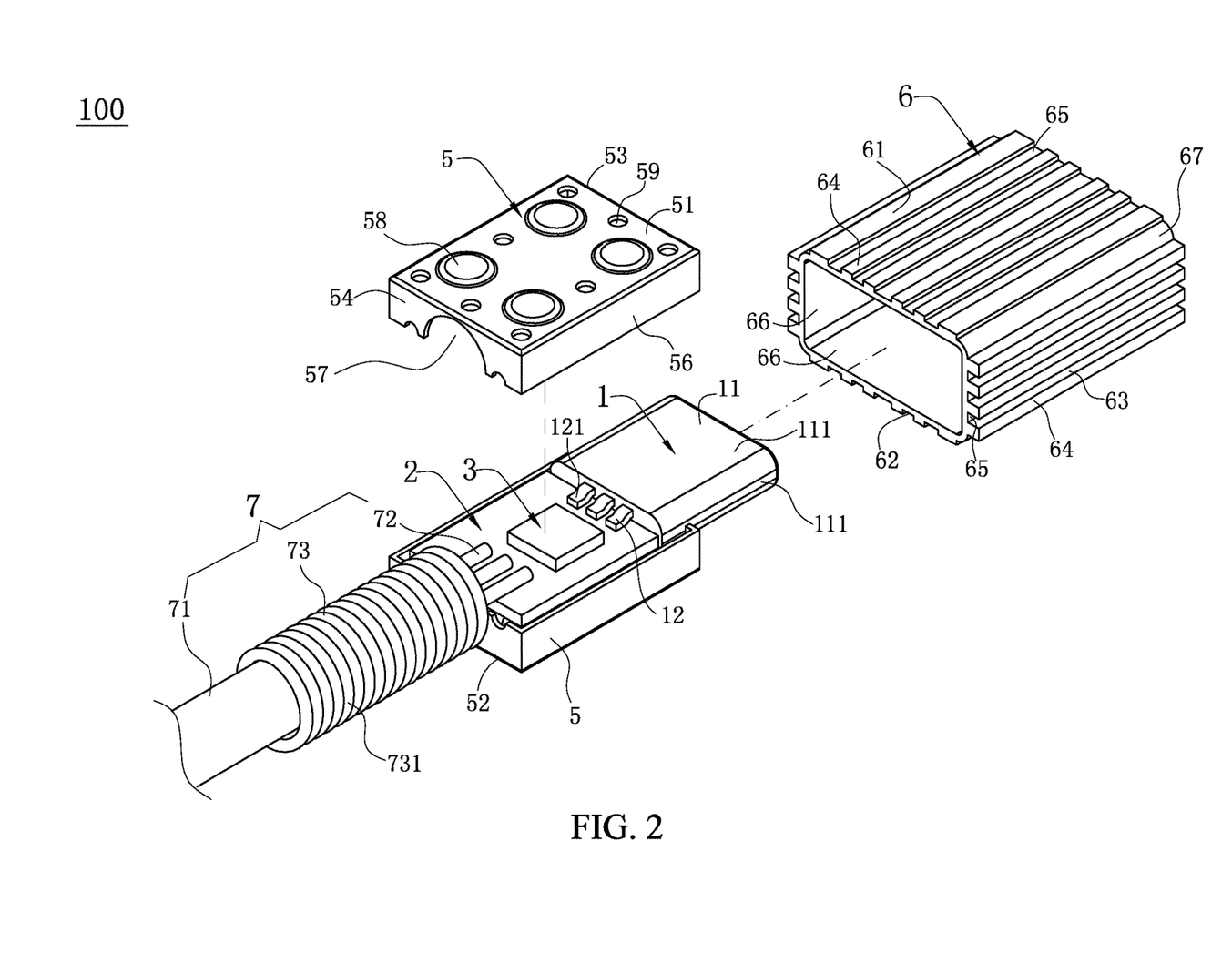
FIG. 2 is a perspective exploded view of partial elements of an electrical connector assembly according to the embodiment of the present invention.
Figure 3:
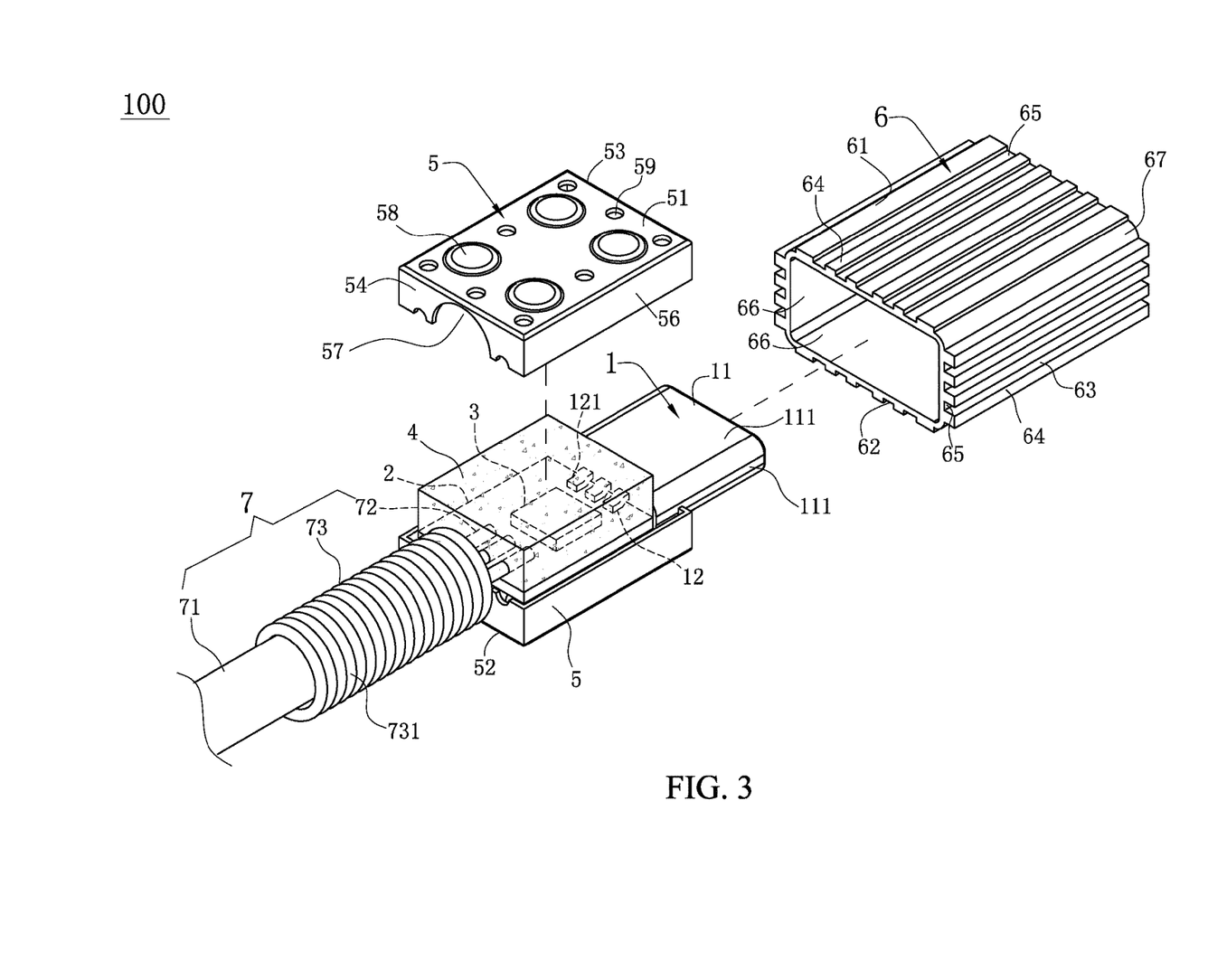
FIG. 3 is a partial perspective exploded view of an electrical connector assembly according to the embodiment of the present invention.

Referring to FIG. 2 and FIG. 3, the connector 1 is located in front of the circuit board 2. The connector 1 includes a shell 11 and a plurality of terminals 12 (multiple terminals are provided in the present embodiment, and in other embodiments, there can be only one terminal). The shell 11 is provided with multiple outer surfaces 111. Each terminal 12 is provided with a soldering pin 121. The terminals 12 are accommodated in the shell 11, and the soldering pins 121 protrude out of the shell 11 and are soldered to the circuit board 2.

Referring to FIG. 2 and FIG. 3, the chip 3 is disposed behind the connector 1, and the chip 3 is disposed on one side of the circuit board 2 and electrically connected to the circuit board 2.

Referring to FIG. 2 to FIG. 5, the cable 7 is disposed behind the chip 3. The cable 7 is provided with a rubber core 71, a plurality of core wires 72 (multiple core wires 72 are provided in the present embodiment, and in other embodiments, there can be only one core wire) and a heat dissipation spring 73 sleeving the rubber core 71. The core wires 72 are accommodated in the rubber core 71 and partially protrude out of the rubber core 71 toward the circuit board 2, and the core wires 72 are soldered to the circuit board 2. The heat dissipation spring 73 is provided with a main body portion 731 and a heat dissipation portion 732 extending from the main body portion 731 toward the circuit board 2.

Referring to FIG. 3 to FIG. 6, the metal shell 5 is provided with an upper wall 51, a lower wall 52, a front wall 53, a rear wall 54, a left wall 55 and a right wall 56, where the upper wall 51 and the lower wall 52 are opposite to each other in a vertical direction, the front wall 53 and the rear wall 54 are connected to the upper wall 51 and the lower wall 52 in a front-rear direction, and the left wall 55 and the right wall 56 are connected to the upper wall 51, the lower wall 52, the front wall 53 and the rear wall 54 and are opposite to each other. The upper wall 51, the lower wall 52, the front wall 53, the rear wall 54, the left wall 55 and the right wall 56 enclose an accommodating space 57, and each of the upper wall 51, the lower wall 52, the front wall 53, the rear wall 54, the left wall 55 and the right wall 56 is provided with an inner surface 50. The accommodating space 57 accommodates the circuit board 2 and the chip 3, and partially accommodates the shell 11, the rubber core 71, the main body portion 731 and the heat dissipation portion 732. The upper wall 51, the lower wall 52 and the rear wall 54 are provided with multiple through holes 59 communicating the outside and the accommodating space 57, and multiple thermally conductive portions 58 protrude away from the circuit board 2. In the present embodiment, multiple through holes 59 and multiple thermally conductive portions 58 are provided, and the thermally conductive portions 58 are disposed on the metal shell 5. In other embodiments, there can be only one through hole 59 or only one thermally conductive portion 58. The thermally conductive portion 58 may be disposed only on the heat dissipation member 6, or the thermally conductive portions 58 may be disposed on the metal shell 5 and the heat dissipation member 6 respectively. The rear wall 54 is in contact with the main body portion 731.

Figure 4:
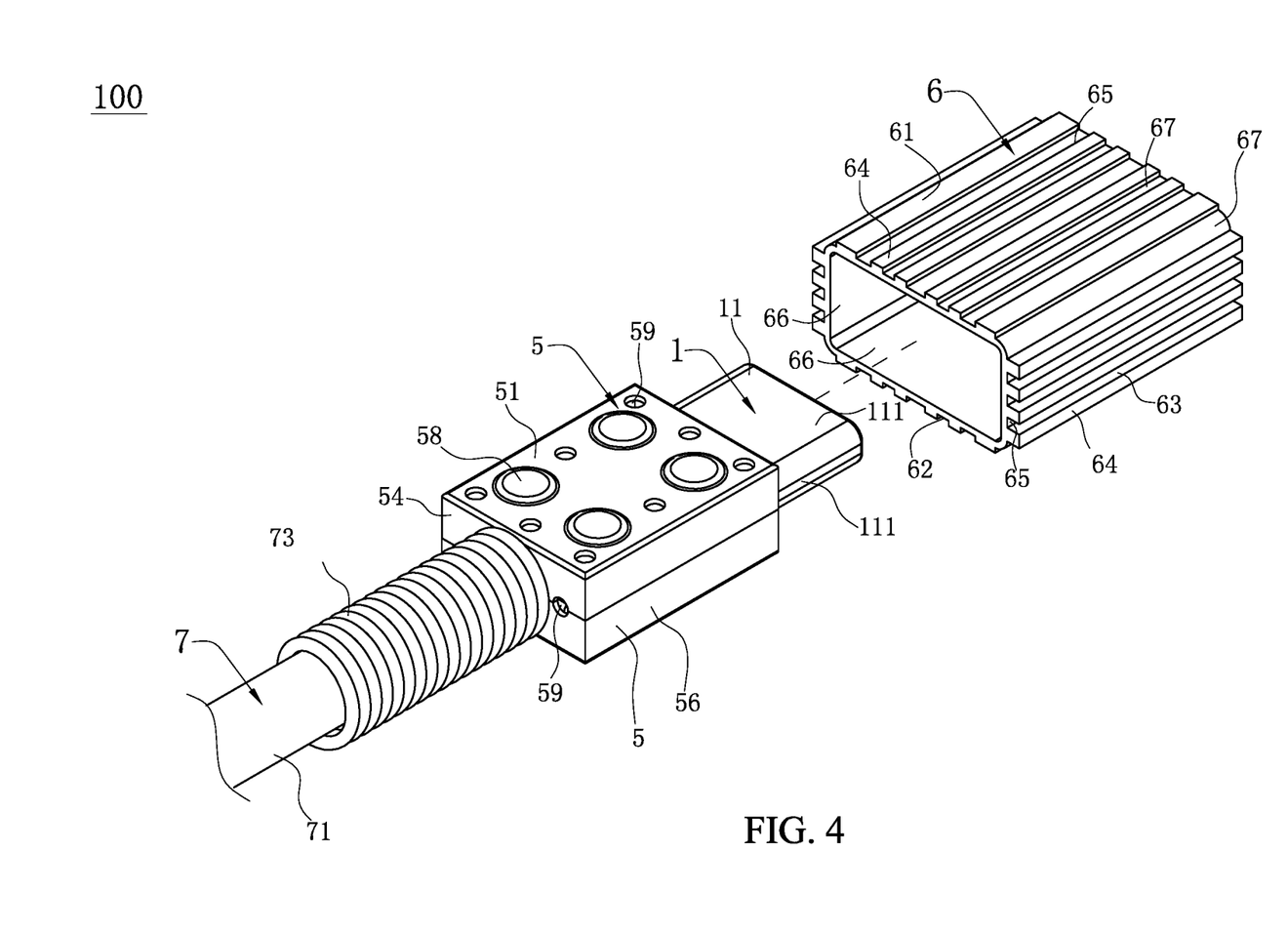
FIG. 4 is another partial perspective exploded view of an electrical connector assembly according to the embodiment of the present invention.
Figure 5:
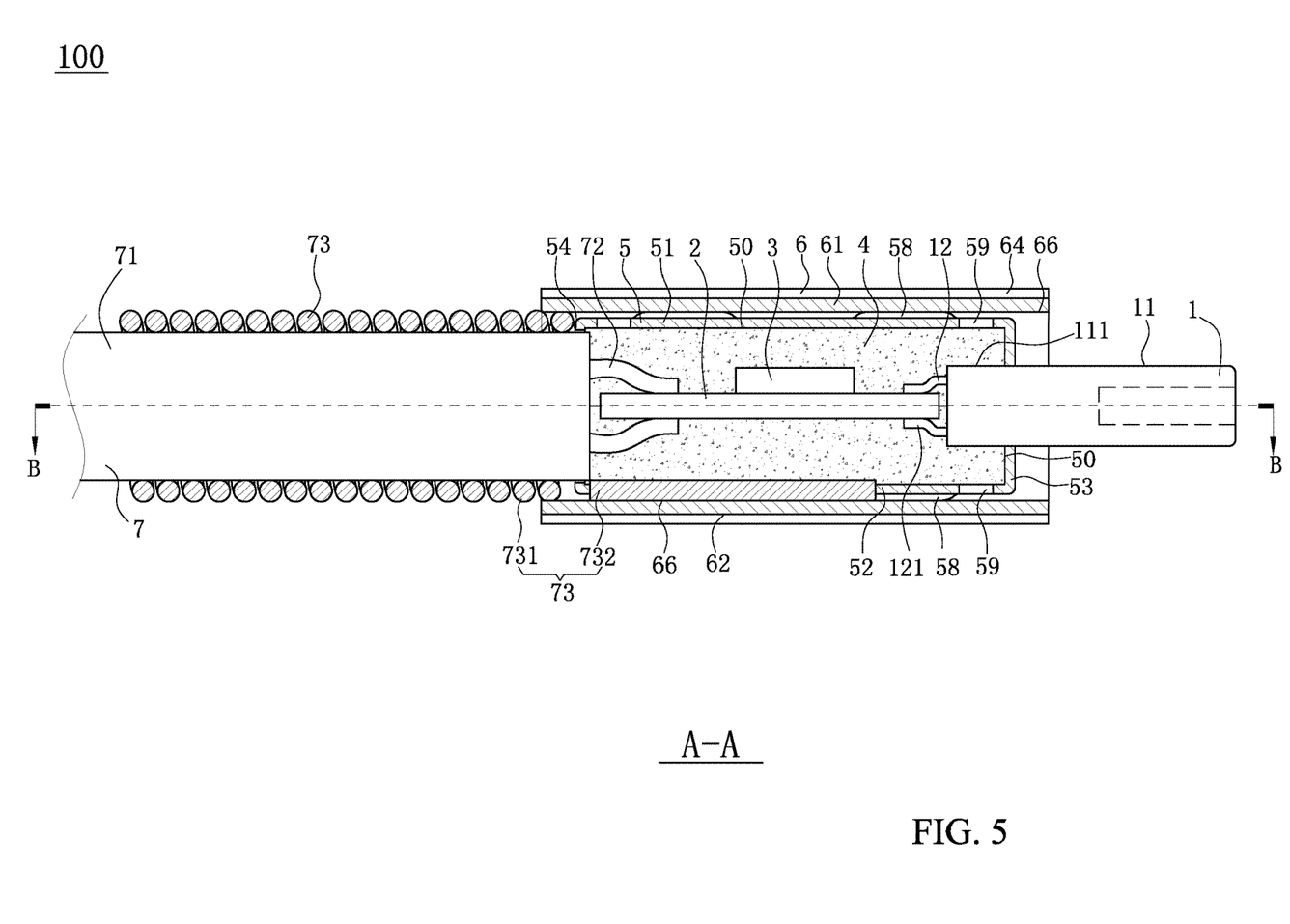
FIG. 5 is a sectional view of FIG. 1 along an A-A direction.
Figure 6:
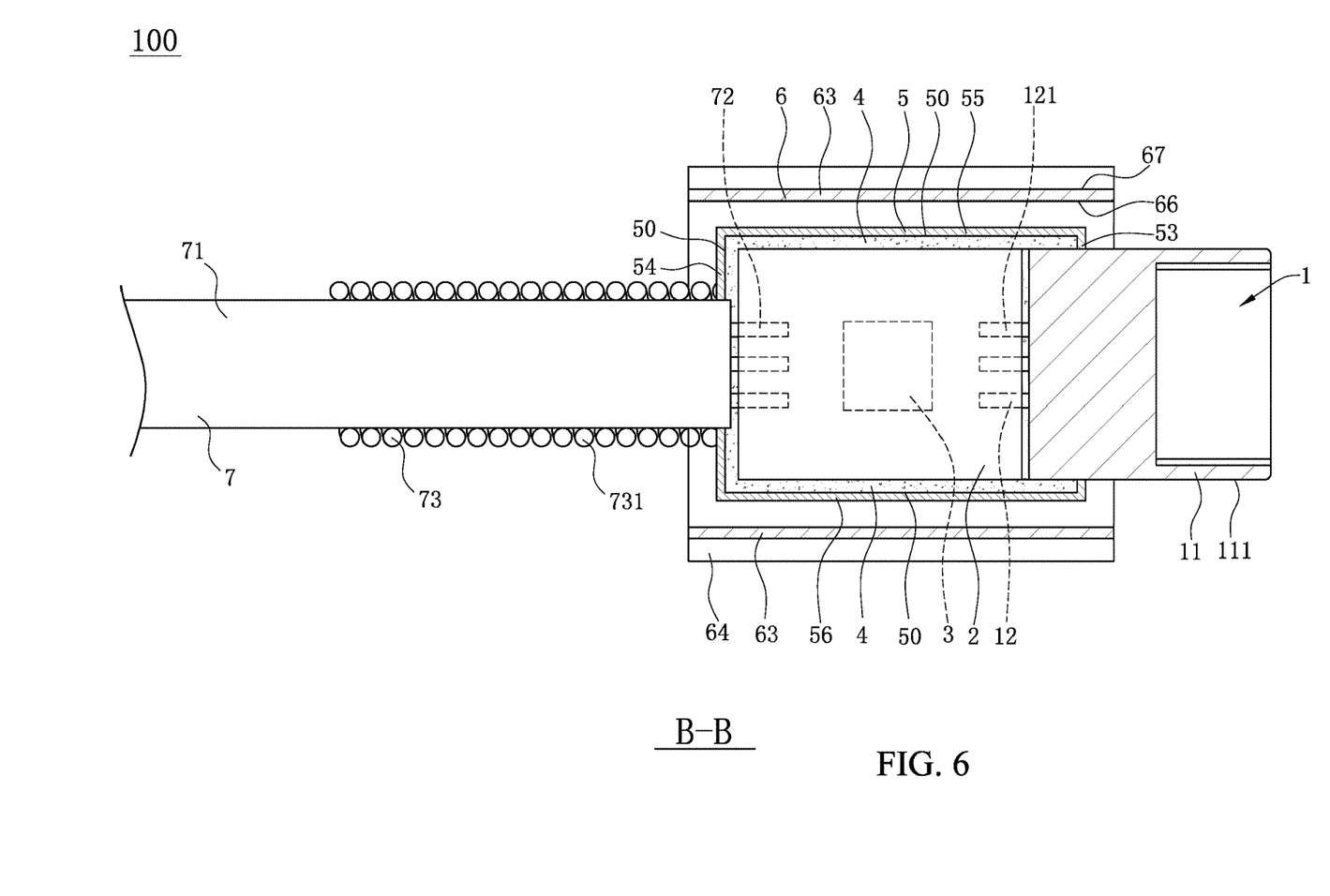
FIG. 6 is a sectional view of FIG. 5 along a B-B direction.

Referring to FIG. 4 to FIG. 6, the heat dissipation member 6 covers the metal shell 5, a part of the shell 11 and a part of the heat dissipation spring 73. The heat dissipation member 6 is provided with a top wall 61, a bottom wall 62 and two side walls 63, where the top wall 61 and the bottom wall 62 are opposite to each other in the vertical direction, and the two side walls 63 are connected to the top wall 61 and the bottom wall 62. Each of the top wall 61, the bottom wall 62 and the two side walls 63 is provided with an inner wall surface 66 and an outer wall surface 67, and the outer wall surface 67 is provided with a plurality of fins 64. In the present embodiment, multiple fins 64 are provided and arranged in a front-rear direction longitudinally. The front-rear direction is an insertion direction of the electrical connector 1 and a mating connector, thus ensuring the arranging direction of the fins 64 to be identical to the insertion direction, and increasing the heat dissipating ability of the heat dissipation member 6. In other embodiments, two fins 64 can be arranged transversely or obliquely. Multiple grooves 65 are provided between each two fins 64. In the present embodiment, multiple grooves 65 are provided. In other embodiments, there can be only one groove 65. The two inner wall surfaces 66 opposite to each other in the vertical direction are in contact with the thermally conductive portion 58 and the main body portion 731, and the inner wall surface 66 located at the bottom is further in contact with the heat dissipation portion 732.

Referring to FIG. 2, FIG. 5 and FIG. 6, the inner film 4 is injection-molded in the accommodating space 57. The inner film 4 may be a thermally conductive rubber, a thermally conductive paste, a thermally conductive silver colloid, a mixture of the thermally conductive rubber and other materials, a mixture of the thermally conductive paste and other materials, or a mixture of the thermally conductive silver colloid and other materials. The inner film 4 may also be formed by mixing an insulating material and a conductive material, or formed by mixing an insulating material and a graphite material. Therefore, the heat conductivity of the inner film 4 is superior to that of a common plastic material and air, and the inner film has a great heat conduction performance. The proportion of the mass of the conductive material to the inner film 4 is lower than the proportion of the mass of the insulating material to the inner film 4, and the proportion of the mass of the graphite material to the inner film 4 is also lower than the proportion of the mass of the insulating material to the inner film 4. Thus, it is ensured that the inner film 4 only has a required heat dissipation function instead of a conductive function. The insulating material may be, but is not limited to, polyethylene, polyvinyl chloride, polyurethane, TPE (Thermoplastic Elastomer), AB glue, epoxy resin, hot melt glue or the like, and may further include other thermoplastics or thermosetting plastics. The conductive material may be, but not limited to, a metal powder, diamond powder or the like, but is not limited thereto. By injection-molding the inner film 4 in the accommodating space 57, the inner film 4 is in contact with all the inner surfaces 50, and the inner film 4 wraps the chip 3 and the circuit board 2 and partially wraps the connector 1 and the rubber core 71, such that the inner film 4 is in contact with the chip 3 and multiple surfaces of the circuit board 2 to conduct much heat generated by the chip 3 to the inner film 4 more rapidly. Meanwhile, the inner film 4 is also in contact with all the outer surfaces 111 and in contact with the soldering pin 121, the core wire 72 and the heat dissipation portion 732, and the inner film 4 is exposed from the through hole 59.

Figure 7:
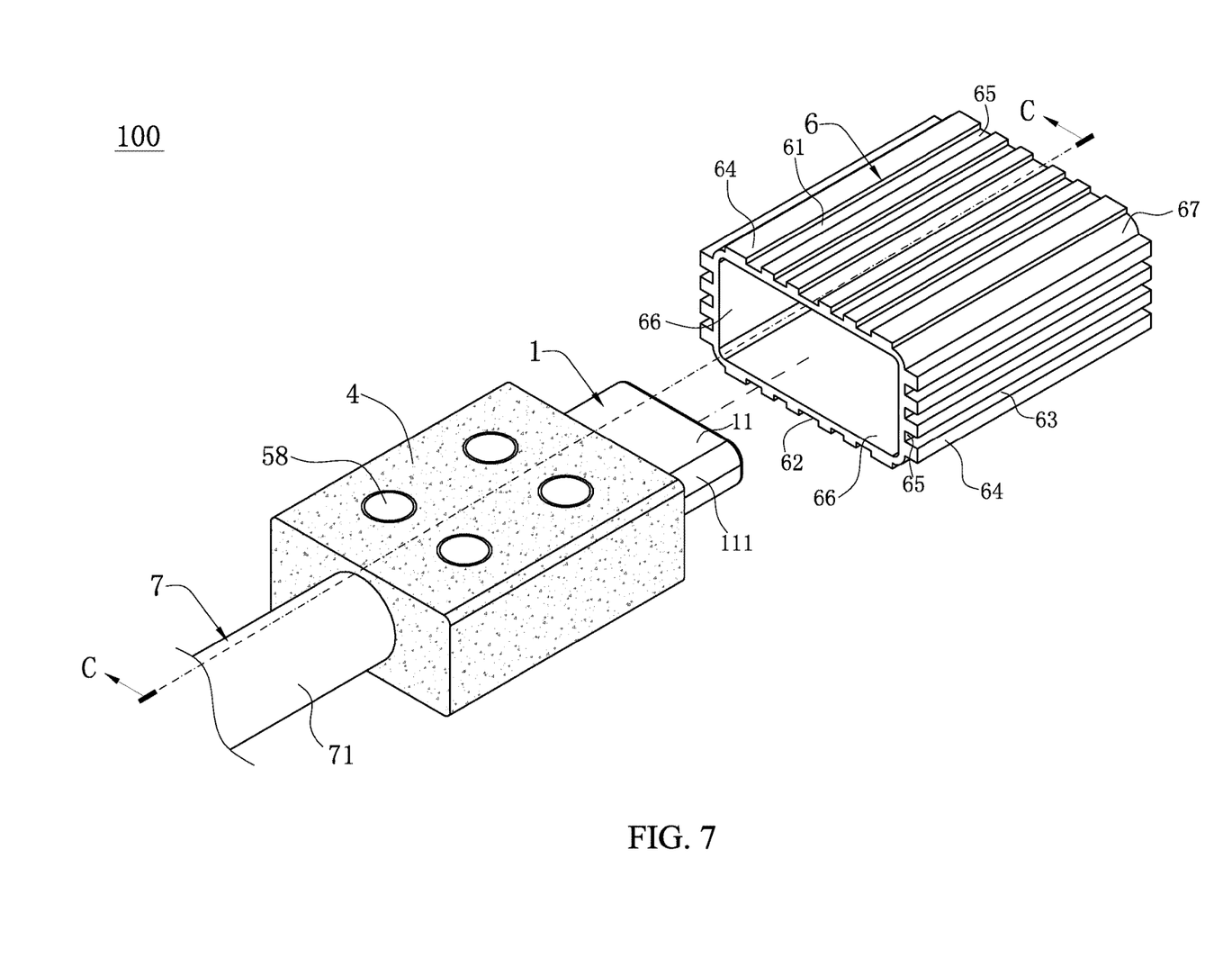
FIG. 7 is a partial perspective exploded view of an electrical connector assembly according to another embodiment.
Figure 8:
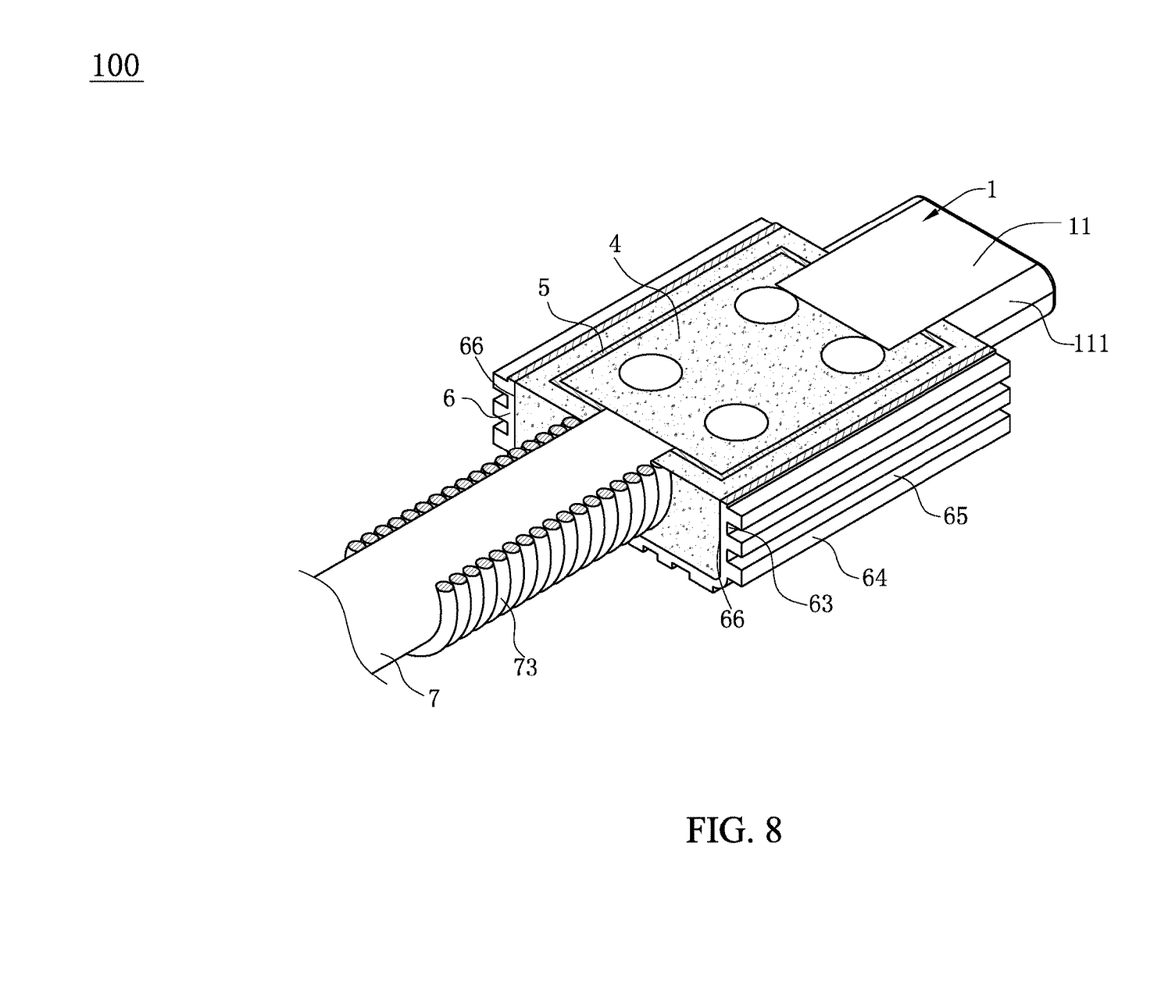
FIG. 8 is a perspective sectional view of an electrical connector assembly according to another embodiment.
Figure 9:
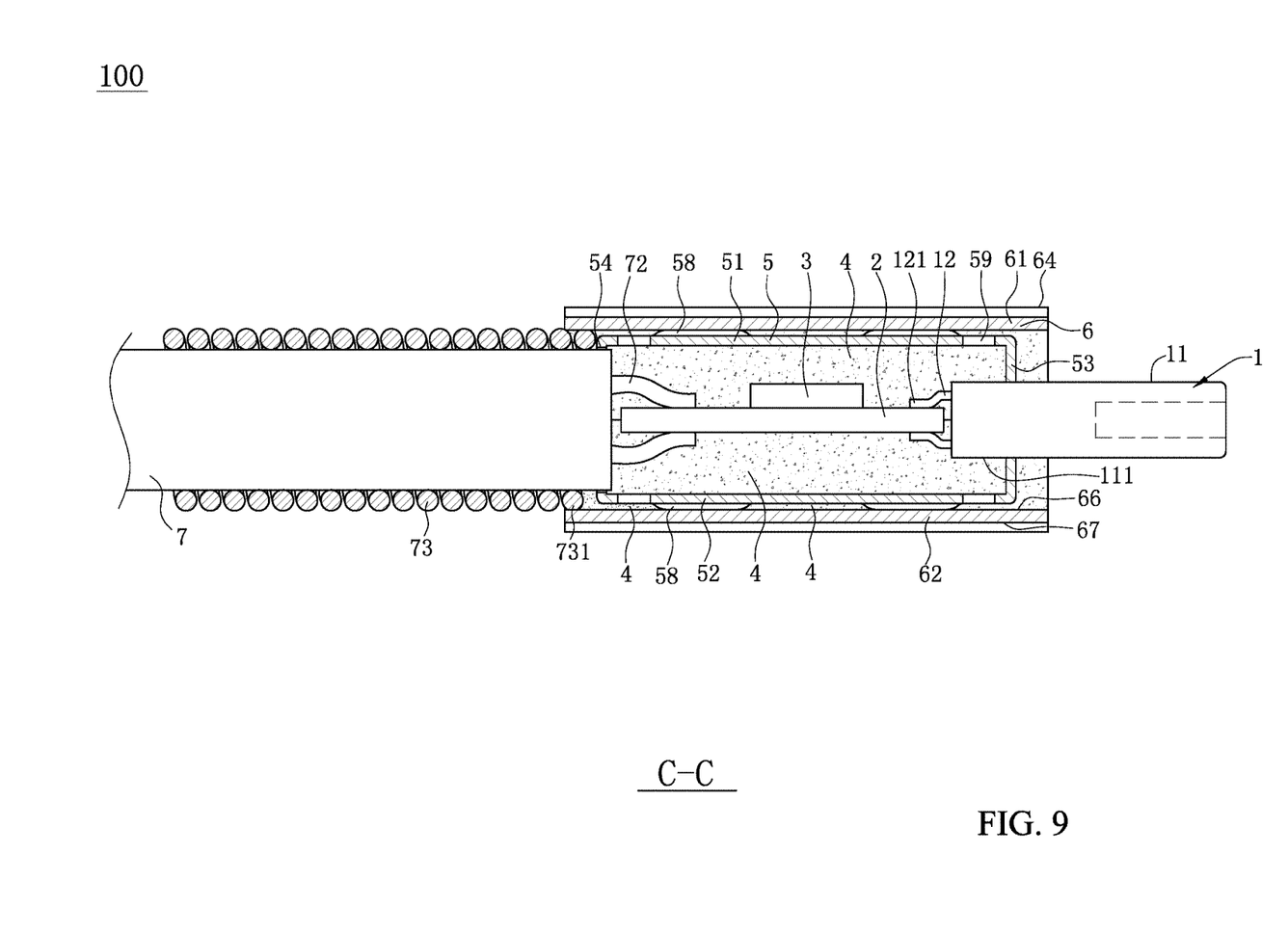
FIG. 9 is a sectional view of assembled elements in FIG. 7 along a C-C direction.

Referring to FIG. 7 to FIG. 9, which shows another embodiment of the present invention. The difference between this embodiment and the main embodiment only exists in that the inner film 4 further wraps the metal shell 5 and covers the upper wall 51, the lower wall 52, the front wall 53, the rear wall 54, the left wall 55 and the right wall 56. Therefore, the inner film 4 is located between the metal shell 5 and the heat dissipation member 6 and fills in a gap between the heat dissipation member 6 and the metal shell 5, such that the inner film 4 is in further contact with all the inner wall surfaces 66 and the main body portion 731.

To sum up, the electrical connector assembly 100 according to certain embodiments of the present invention has the following beneficial effects.

1. The inner film 4 is injection-molded in the accommodating space 57. The inner film 4 is made of a high heat conductive material, and the heat conductivity thereof is higher than that of a common plastic material and air, thereby facilitating improvement of the heat dissipation performance.

2. The inner film 4 wraps the chip 3 such that multiple surfaces of the chip 3 are in contact with the inner film 4, increasing a contact area between the chip 3 and the inner film 4, such that heat generated by the chip 3 can be conducted to the inner film 4 more rapidly, thereby more facilitating enhancement of the heat dissipation effect.

3. The inner film 4 is injection-molded in the accommodating space 57, such that the inner film 4 is in contact with all the inner surfaces 50 on the basis of wrapping the chip 3 by the inner film 4, increasing a contact area between the inner film 4 and the metal shell 5, such that the inner film 4 can conduct heat obtained from the chip 3 to the metal shell 5 more rapidly and dissipate the heat into air, thereby enhancing the heat dissipation effect.

4. The heat dissipation member 6 is added, and the thermally conductive portions 58 are in contact with the heat dissipation member 6, such that the heat of the metal shell 5 can be conducted to the heat dissipation member 6, thereby further enhancing the heat dissipation effect.

5. The heat dissipation portion 732 protrudes into the metal shell 5 and is in contact with the inner film 4, such that the inner film 4 can conduct heat obtained from the chip 3 to the heat dissipation spring 73 through the heat dissipation portion 732, and a new heat dissipation path is provided.

6. The main body portion 731 is in contact with the rear wall 54, such that the heat of the metal shell 5 can be directly conducted to the heat dissipation spring 73 in addition to being conducted to the heat dissipation member 6 through the thermally conductive portion 58, and another new heat dissipation path is provided.

7. The inner film 4 is injection-molded in the accommodating space 57, and is in contact with the core wires 72 and the soldering pins 121, thus achieving the effect of fixing the core wire 72 and the soldering pin 121.

8. The heat dissipation member 6 is provided with the fins 64 and the grooves 65, such that the contact area between the heat dissipation member 6 and air can be increased, heat can be dissipated into the air more rapidly, and the heat dissipation effect is enhanced.

9. Because the inner film 4 is exposed from the through hole 59, the inner film 4 can dissipate heat generated by the chip 3 into the air in addition to conducting the heat out of the metal shell 5, and another new heat dissipation path is provided.

10. The inner film 4 is in contact with all the outer surfaces 111, and the heat obtained from the chip 3 can be conducted to the shell 11 and dissipated into the air, and another new heat dissipation path is provided.

In another embodiment, the heat dissipation effect is further enhanced.

11. The inner film 4 is in contact with all the inner wall surfaces 66, and therefore the heat generated by the chip 3 can be directly conducted to the heat dissipation member 6 through the inner film 4, and another new heat dissipation path is provided.

12. The inner film 4 is in contact with the main body portion 731 because of coverage over the metal shell 5. Therefore, the inner film 4 can directly conduct heat generated by the chip 3 to the heat dissipation spring 73 in addition to conducting the heat out of the metal shell 5 and the heat dissipation member 6, and another new heat dissipation path is provided.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector assembly, comprising:
   a circuit board;
   a connector, located in front of the circuit board and electrically connected to the circuit board;
   a chip, provided on the circuit board, and electrically connected to the circuit board;
   a metal shell, covering the connector and the circuit board; and
   an inner film, made of a high heat conductive material and wrapping the chip and the circuit board, wherein at least a part of the inner film is located between the metal shell and the circuit board.

2. The electrical connector assembly of claim 1, wherein the inner film is in contact with the metal shell.

3. The electrical connector assembly of claim 1, wherein the inner film is in contact with all inner surfaces of the metal shell.

4. The electrical connector assembly of claim 1, wherein the connector is provided with a shell, and the inner film is in contact with the shell.

5. The electrical connector assembly of claim 4, wherein the inner film is in contact with all outer surfaces of the shell.

6. The electrical connector assembly of claim 1, wherein the connector is provided with at least one terminal being soldered to the circuit board, and the inner film is in contact with the at least one terminal.

7. The electrical connector assembly of claim 1, wherein a heat dissipation member wraps the metal shell, and a thermally conductive portion is located between the metal shell and the heat dissipation member.

8. The electrical connector assembly of claim 7, wherein the thermally conductive portion is provided on the metal shell and is in contact with the heat dissipation member, or the thermally conductive portion is provided on the heat dissipation member and is in contact with the metal shell.

9. The electrical connector assembly of claim 7, wherein at least two fins are provided on an outer wall surface of the heat dissipation member, and at least one groove is provided between each of two adjacent fins of the at least two fins.

10. The electrical connector assembly of claim 9, wherein the at least two fins are arranged in a front-rear direction longitudinally.

11. The electrical connector assembly of claim 1, wherein the inner film is partially exposed from the metal shell and wraps the metal shell.

12. The electrical connector assembly of claim 11, wherein a heat dissipation member wraps the metal shell, and the inner film is located between the metal shell and the heat dissipation member and is in contact with the heat dissipation member.

13. The electrical connector assembly of claim 12, wherein the inner film is in contact with all inner wall surfaces of the heat dissipation member.

14. The electrical connector assembly of claim 1, wherein a cable is provided with a core wire being soldered to the circuit board, and the inner film is in contact with the core wire.

15. The electrical connector assembly of claim 14, wherein a heat dissipation spring is provided to sleeve the cable, the heat dissipation spring is provided with a main body portion, and the main body portion is in contact with the metal shell.

16. The electrical connector assembly of claim 15, wherein the heat dissipation spring is provided with a heat dissipation portion extending into the metal shell from the main body portion, and the inner film is in contact with the heat dissipation portion.

17. The electrical connector assembly of claim 1, wherein the inner film is composed of an insulating material and a conductive material, and a proportion of the mass of the conductive material to the inner film is lower than a proportion of the mass of the insulating material to the inner film.

18. The electrical connector assembly of claim 1, wherein the metal shell is provided with at least one through hole, and the inner film is exposed from the at least one through hole.

19. The electrical connector assembly of claim 1, wherein the inner film completely wraps the circuit board.

20. The electrical connector assembly of claim 1, wherein the inner film is composed of a graphite material and an insulating material, and a proportion of the mass of the graphite material to the inner film is lower than a proportion of the mass of the insulating material to the inner film.

* * * * *